United States Patent
Hung (10) Patent No.: US 7,222,289 B2
(45) Date of Patent: May 22, 2007

(54) CHANNEL PROCESSOR USING REDUCED COMPLEXITY LDPC DECODER

(75) Inventor: William Ching-Chit Hung, Irvine, CA (US)

(73) Assignee: Certance LLC, Costa Mesa, CA (US)

( * ) Notice: Subject to any disclaimer, the term of this patent is extended or adjusted under 35 U.S.C. 154(b) by 487 days.

(21) Appl. No.: 10/673,181

(22) Filed: Sep. 30, 2003

(65) Prior Publication Data

US 2004/0093554 A1 May 13, 2004

Related U.S. Application Data

(60) Provisional application No. 60/415,151, filed on Sep. 30, 2002.

(51) Int. Cl.
*G06F 11/10* (2006.01)
(52) U.S. Cl. ..................................... 714/807
(58) Field of Classification Search ............... 714/769, 714/807
See application file for complete search history.

(56) References Cited

OTHER PUBLICATIONS

Kurkoski et al., Joint message-passing decoding of LDPC codes and partial-response channels, Jun. 2002, IEEE Trans. on Info. Theory vol. 48, No. 6, p. 1410-1422.*
Song et al., Applications of low-density parity-check codes to magnetic recording channels, May 2001, Ieee Journal on selected areas in COmm. vol. 19, No. 5, p. 918-923.*
Futaki et al. Low-Density parity-check codes OFDM systems, 2001, IEEE, p. 82-86.*
Mittelholzer et al. Reduced complexity decoding of low density parity check codes for generalized partial response channels, Mar. 2001, IEEE, Trans. on Magnetics, vol. 37., No. 2, p. 721-728.*

* cited by examiner

*Primary Examiner*—Shelly Chase
(74) *Attorney, Agent, or Firm*—Mark J. Spolyar (57) ABSTRACT

A low-density parity check device can process data using a special low-density parity check matrix having a size of n-rows by m-columns. By styling the matrix such that the matrix is composed of p equal-size sqaure sub-matrices, only the first row of the first sub-matrix need be generated and stored. By then further constraining each of the sub-matrices to form various sub-portions, with each sub-portion constructed such that any two columns within the sub-portion will have no common location containing a non-zero entry, processing advantages are gained.

21 Claims, 10 Drawing Sheets

CHANNEL PROCESSOR USING REDUCED COMPLEXITY LDPC DECODER

RELATED APPLICATION

This application contains subject matter related to the subject matter disclosed in Provisional U.S. Patent Application Ser. No. 60/415,151, filed on Sep. 30, 2002, entitled "MAGNETIC RECORDING CHANNEL PROCESSOR USING REDUCED COMPLEXITY PR4-LDPC DECODER".

FIELD OF THE INVENTION

This invention relates to methods and systems for decoding data using efficient processing architectures.

DESCRIPTION OF RELATED ART

In the data recording industry, there is an ongoing effort to increase the amount of information that can be stored and retrieved in various storage media. Unfortunately, increasing the recording density on a given magnetic medium will cause a decrease in the Signal-to-Noise Ratio (SNR) of any data resident on the medium, which will subsequently result in an increased Bit-Error Rate (BER) for any detection system usable to recover such resident data.

Fortunately, the performance of digital storage systems (as well as communication systems) suffering from an imperfect SNR can be significantly improved by the use of any number of error correction code schemes. As a result, most, if not all, recording (and communication) systems use some form of error correction coding, which generally involves systematically adding redundant information to a stream of data to insure that individual bit errors generated during a particular write/read/transmission operation can be detected and corrected.

In recent years, iterative correction codes have increasingly replaced the more traditionally used block and convolutional correction codes. While iterative codes, such as turbo codes and low-density parity-check (LDPC) codes, have shown very good performance for magnetic storage systems, such correction codes must of course be iteratively decoded. Unfortunately, iterative decoders often require substantial and complex computational power, and thus relatively expensive circuitry, to operate. Accordingly, improved methods and systems related to iterative decoding techniques are desirable.

SUMMARY OF THE INVENTION

As described herein, an apparatus for decoding a stream of data recovered from a magnetic medium can use a specially designed low-density parity check device coupled to the magnetic medium.

In various embodiments, the low-density parity check device can process data using a special low-density parity check matrix having a size of two-hundred seventy-two rows by four-thousand six-hundred and twenty-four columns. By configuring the matrix such that the matrix is formed of seventeen sub-matrices of two-hundred seventy-two rows by two-hundred seventy-two columns, only the locations of the non-zero entries in the first row of the first sub-matrix will be required to be actually generated and stored because of the structured relationship among the seventeen sub-matrices and the property that each row in a sub-matrix is the cyclic-shift of the previous row in the same sub-matrix, thus saving valuable memory resources. By then further constraining each sub-matrix to include seventeen sub-portions with each sub-portion constructed such that no two columns within a sub-portion will have a common location containing a non-zero entry, even greater processing advantages are gained.

In other embodiments, the parity check device can include a checks-to-bits device that determines the minimum-entry for a particular row of the low-density parity check matrix, as well as determine the second-minimum-entry and a sign value for the same particular row. By coupling this checks-to-bits device with a bits-to-checks device, a sub-decoder is formed that requires as few as twelve iterations to produce data having an acceptably low error rate.

In still other embodiments, the data on the magnetic medium is formed using a number of data blocks with each data block including a data field, a sync field and a tone field. The decoding apparatus can accordingly incorporate a tone detector that detects a frequency in the tone fields to provide framing information for a partial response signaling device, thus simplifying processing. Further, the decoding device can incorporate a sync detector that detects a known sequence in the sync fields to provide alignment information for aligning data for the low-density parity check device.

Other features and advantages of the present invention will become apparent in the following drawings and descriptions.

DESCRIPTION OF THE DRAWINGS

The invention is described in detail with regard to the following figures, wherein like numerals reference like elements, and wherein.

DETAILED DESCRIPTION OF THE INVENTION

Figure 1:
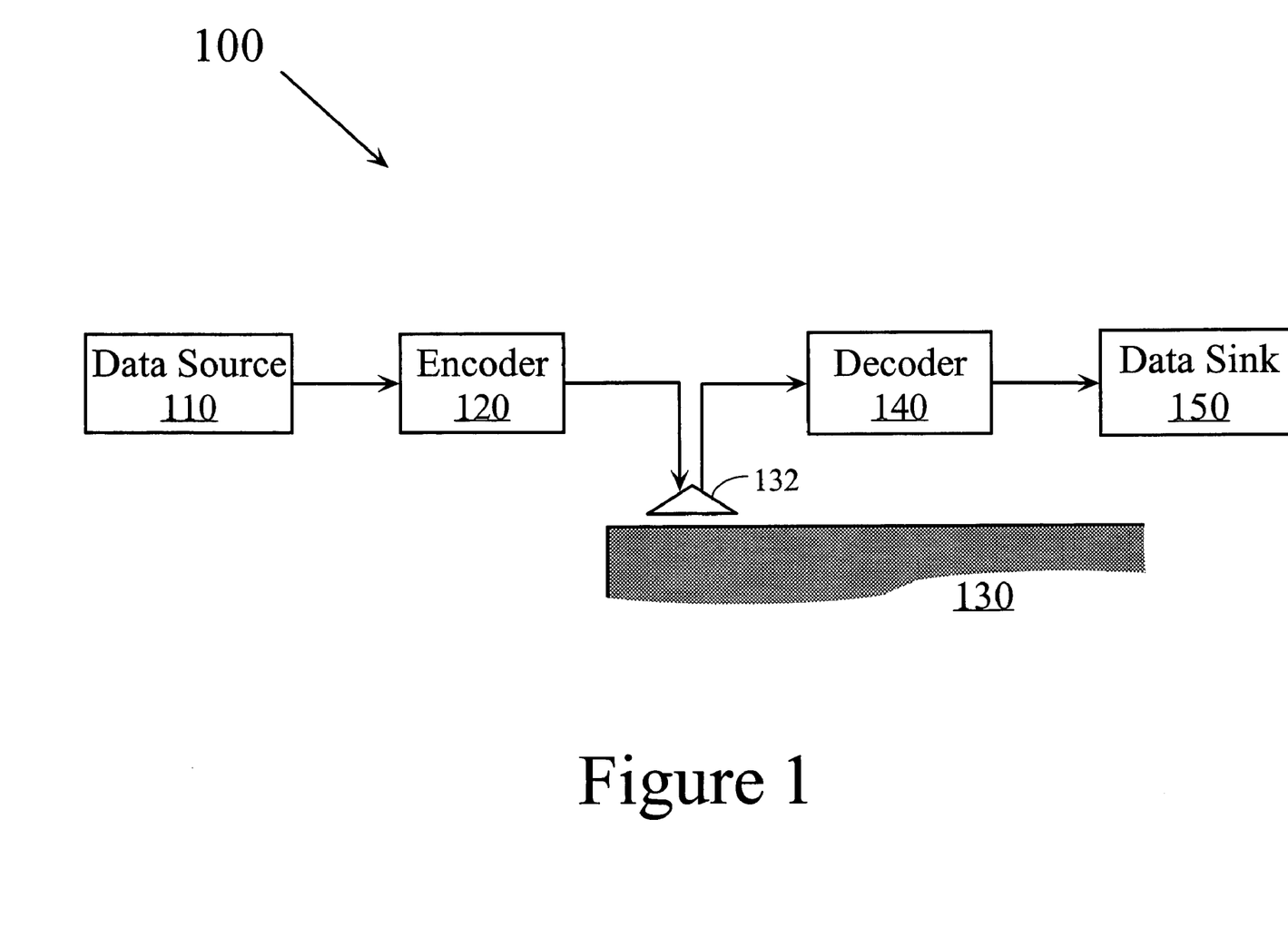
FIG. 1 is a block diagram of a magnetic storage system according to the present invention.

FIG. 1 is a block diagram of a data storage system 100 according to the present invention. As shown in FIG. 1, the data storage system 100 includes a data source 110, an encoder 120, a recording medium 130 having a read/write head 132, a decoder 140 and a data sink 150.

In a first mode of operation, an amount of digital user data is transferred from the data source 110 to the encoder 120. The encoder 120, in turn, can condition and format the received data using a number of operations, such as a Run-Length Limiting (RLL) encoding operation, a Low-Density Parity Check (LDPC) encoding operation and a data-bit shuffling operation, to form blocks of data. Various tone and synchronization (sync) signals can then be added to the data blocks, and the resultant modified data blocks can then be processed using a pre-coder and Partial Response signaling (PR4) encoder as is well known in the digital data recording industry.

As various blocks of encoded data are produced by the encoder 120, the encoder 120 can feed the data blocks to the read/write head 132. Assuming that the read/write head 132 is properly configured, energized and provided with a motion relative to the recording medium 130, the read/write head 132 will transfer the various data blocks onto the recording medium 130.

In a second mode of operation, data blocks residing on the recording medium 130 can be read using the read/write head 132, and provided to the decoder 140. The decoder 140, in turn, can extract user data from the data blocks using a number of operations described below, and provide the user data to the data sink 150.

The exemplary data source 110 can be any known or later developed source that is capable of providing digital data to the encoder 120. Similarly, the exemplary data sink 150 can be any known or later developed device that is capable of receiving data from the decoder 140.

The exemplary encoder 120 and decoder 140 are implemented using dedicated VLSI logic. However, the particular form of the encoder 120 or decoder 140 can vary according to the particular design needs of a given recording system to include any combination of electronic and/or optical hardware processing without departing from the spirit and scope of the present invention.

The exemplary recording medium 130 is a magnetic-base substrate and the exemplary read/write head 132 is a transducer capable of receiving electrical signals and converting the electronic signals to magnetic fields capable of imprinting digital data on the magnetic recording medium 130, and similarly capable of sensing magnetic fields residing on the magnetic recording medium 130 and converting the sensed magnetic fields to electrical signals. However, it should be appreciated that the particular form of the recording medium 130 and read/write head 132 can vary to embody any number of magnetic recording systems, such as magnetic-based hard disks, floppy disk, tape-based systems and the like, without departing from the spirit and scope of the present invention.

Further, the recording medium 130 and read/write head 132 can in various embodiments take various forms to accommodate any number of optical recording systems, or even be replaced with a data transmission medium for use in any number of communication systems, such as wireless and optical communication systems, without departing from the spirit and scope of the present invention.

Figure 2:
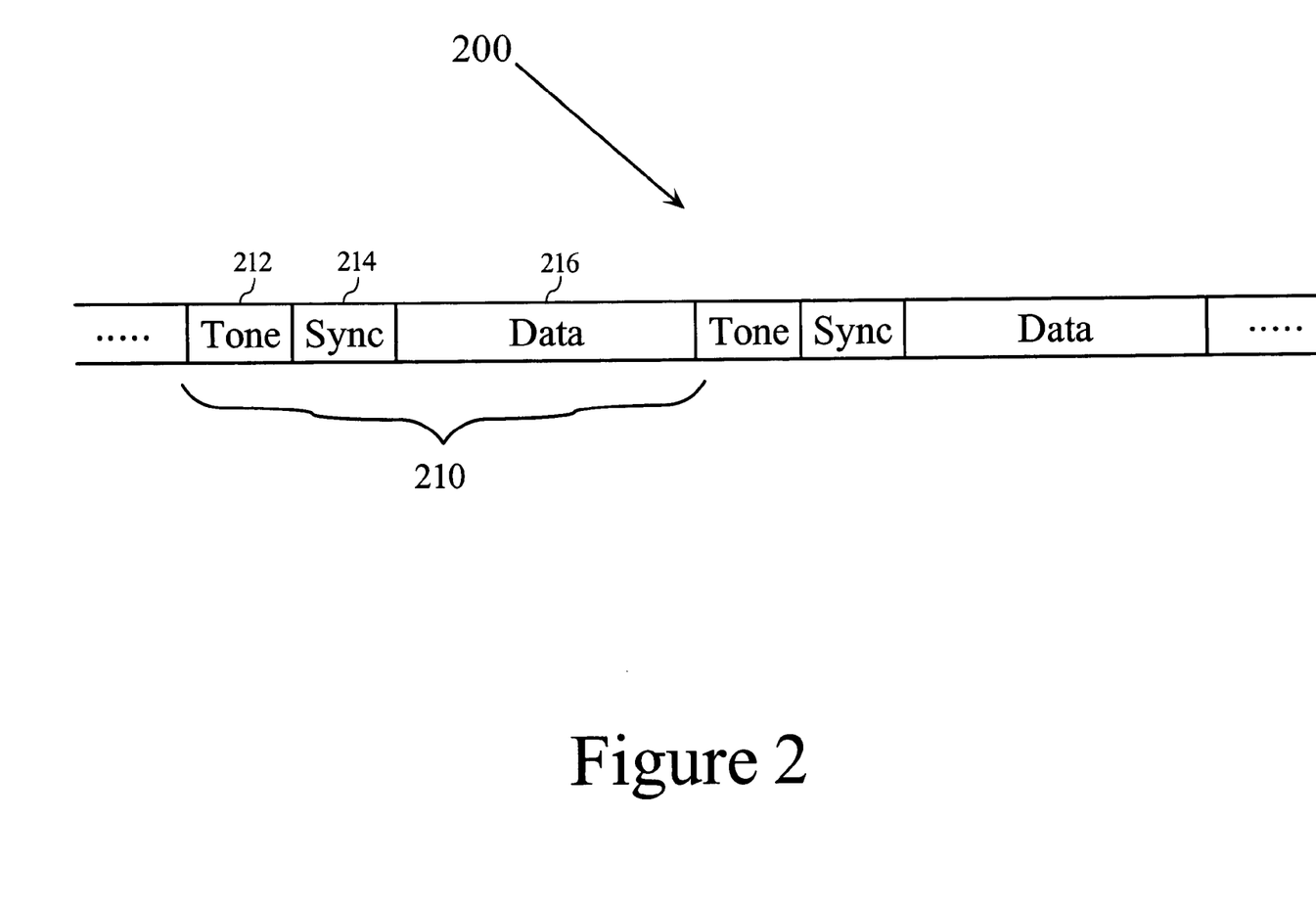
FIG. 2 depicts the data format used in the storage system of FIG. 1 according to the present invention.

FIG. 2 depicts the data format used in the exemplary system 100 of FIG. 1. As discussed above, user data provided by the data source 110 is encoded, then formed into blocks having various tone and synchronization (sync) signals added. As shown in FIG. 2, the exemplary data format includes a stream of data 200 partitioned into successive data blocks 210, with each data block 210 including a tone field 212 containing a signal of a given frequency, a sync field 214 containing an identifiable sequence of digital bits and a data field 216 containing encoded user data.

Figure 3:
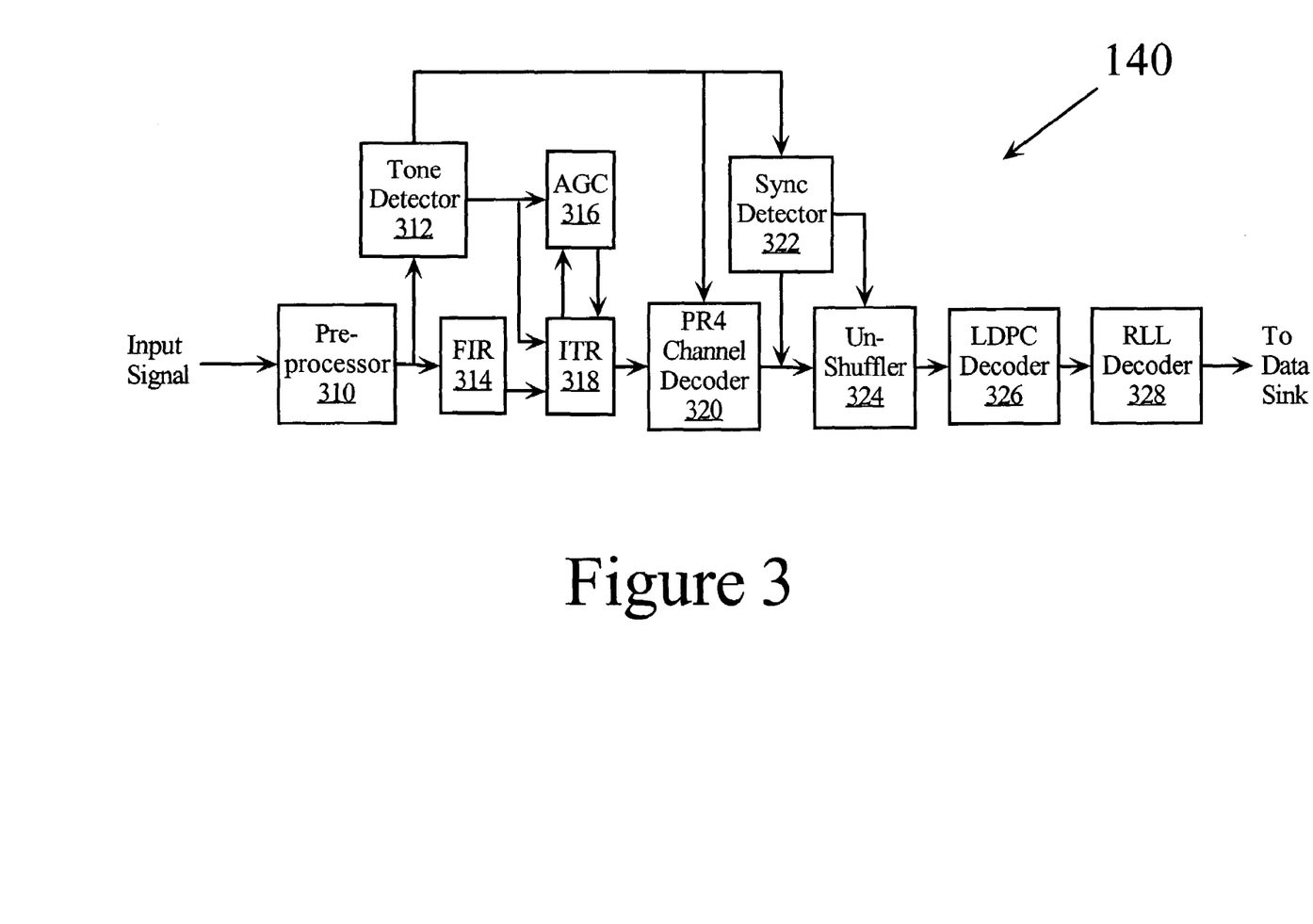
FIG. 3 is a block diagram of the decoder of FIG. 1 according to the present invention.

FIG. 3 is a block diagram of the decoder 140 of FIG. 1. As shown in FIG. 3, the decoder 140 includes a pre-processor 310, a tone-detector 312, a Finite-Impulse-response (FIR) filter 314, an Automatic Gain Control (AGC) device 316, an Interpolate Timing Recovery (ITR) device 318, a PR4 channel decoder 320, a sync detector 322, an un-shuffler 324, a LDPC decoder 326 and an RLL decoder 328. While the exemplary decoder 140 is implemented using various VLSI logic circuits, it should be appreciated that the various devices 10–328 can be implemented using any combinations of signal processing hardware, sequential instruction devices and dedicated logic, without departing from the spirit and scope of the present invention.

In operation, a digitized signal can be received by the pre-processor 310 from an external source, such as a read/write head of a storage media or a receiver of a communication system. The pre-processor 310 can then correct for any asymmetry of the signal caused by any number of external factors, e.g., the non-linearity of a magneto-resistive read/write head. Once the received signal is corrected, the corrected signal can be provided to both the tone detector 312 and FIR 314.

The FIR 314 can receive the corrected signal, perform an equalization process tailored to the requirements of the PR4 channel decoder 320 and provide the equalized signal to the ITR 318. The exemplary FIR 314 uses twenty-four taps with respective programmable weighting coefficients to provide a sum-of-weighted-products output. However, the particular size and makeup of the FIR 314 can vary as required without departing from the spirit and scope of the present invention.

As with the FIR 314, the tone detector 312 can similarly receive the corrected signal from the pre-processor 310. However, the particular function of the tone detector 312 is to detect a signal having a specified frequency, such as the signal of the tone field 212 of FIG. 2. Once the specified frequency is detected, the tone detector 312 can act as a switch for the AGC 316 and ITR 318 to enter a fast acquisition mode, as well as provide framing information to the PR4 channel decoder 320. Still further, the tone detector 312 can be used to qualify the validity of a sync signal given that (according to FIG. 2) sync signals are to immediately follow tone signals. That is, by requiring a valid tone to immediately precede a recognized sync pattern, false sync detection can be avoided.

The exemplary tone detector 312 uses a peak detection scheme that calculates the moving average of the time periods of four peaks, and compares the moving average to an acceptable range of qualifying time periods. However, it should be recognized that the particular form of the tone decoder 312 can vary to implement any number of well known or later developed tone/frequency detection techniques without departing from the spirit and scope of the present invention.

The ITR 318 can receive the equalized signal from the FIR 314 and, once activated by an activation signal from the tone detector 312, the ITR 318 can recover timing and frequency information from the equalized signal, and provide the recovered timing and frequency information to the PR4 channel decoder 320.

The AGC 316 can similarly receive the equalized signal (passed on via the ITR 318) and, once activated by an activation signal from the tone detector 312, the AGC 316 can correct for any gain change of the received signal. Once the AGC 316 appropriately performs its gain-compensation operation, the resultant gain-compensated signal can be provided to the PR4 channel decoder 320 via the ITR 318.

The PR4 channel decoder 320 can receive the gain-compensated equalized signal from the ITR 318 and, using framing information provided by the tone decoder 312, the PR4 channel decoder 320 can perform a partial response decoding operation. The exemplary PR4 channel decoder 320 uses a Bahl, Cocke, Jelinek and Raviv (BCJR) algorithm, which is a known variant of the maximum-a-posteriori (MAP) decoding approach. The BCJR algorithm (also known as the forward-backward algorithm) can provide a trellis-based decoder solution with the exemplary overall trellis operating according to the code $(1-D^2)/(1 \oplus D^2)$. However, it should be appreciated that in other embodiments, the PR4 channel decoder 320 can use other available trellis codes, and in still other embodiments the PR4 channel decoder 320 can use any number of useful non-trellis techniques.

The exemplary PR4 channel decoder 320 operates under the assumption that blocks of user data will be separated by a particular tone. Accordingly, the PR4 channel decoder 320 can use the tone fields 212 of FIG. 2 as framing information, i.e., start and stop signals, thus providing accurate timing information for the PR4 channel decoder 320. Once the PR4 channel decoder 320 has performed its decoding operation, the PR4 decoded data can be provided to the un-shuffler 324 and the sync detector 322.

The sync detector 322 can receive the PR4 decoded data along with the pre-processed data provided by the pre-processor 310 (passed on via the tone detector 312), and detect a sync code, i.e., a predetermined bit sequence/pattern of digital bits in the sync field 214 of FIG. 2. Assuming that a bit sequence recognized as a sync code is immediately preceded by a tone signal (as qualified by the tone detector 312), the sync detector 322 can generate an alignment signal capable of aligning data for the un-shuffler 324 and LPDC decoder 326.

The un-shuffler 324 can receive the PR4 decoded data and, using the alignment signal from the sync detector 322, extract parity bits embedded in a data field and put the parity bits in an appropriate order for the LDPC decoder 326.

The LDPC decoder 326 can receive the un-shuffled data, as well as the alignment signal from the sync detector 322 (via the un-shuffler 324), and perform an LDPC decoding operation. Once an LDPC operation is performed for a block of data, the LDPC decoded data is provided to the RLL decoder 328.

The exemplary LDPC decoder 326 uses a LDPC code having a rate of 16/17, and also uses a special LDPC matrix having a size of 272 rows by 4624 columns (depicted in FIG. 9A as matrix 910) with the LDPC matrix 910 having a constant column weight of 3 and a constant row weight of 51. The particular 272-by-4624 dimensions of the low-density parity check matrix 910 take on special significance and provide substantial advantage for a 16/17 LDPC code rate in view of the chosen column and row weights as the 272-by-4624 dimension can allow for greatly reducing various processing and memory requirements.

Figure 9A:
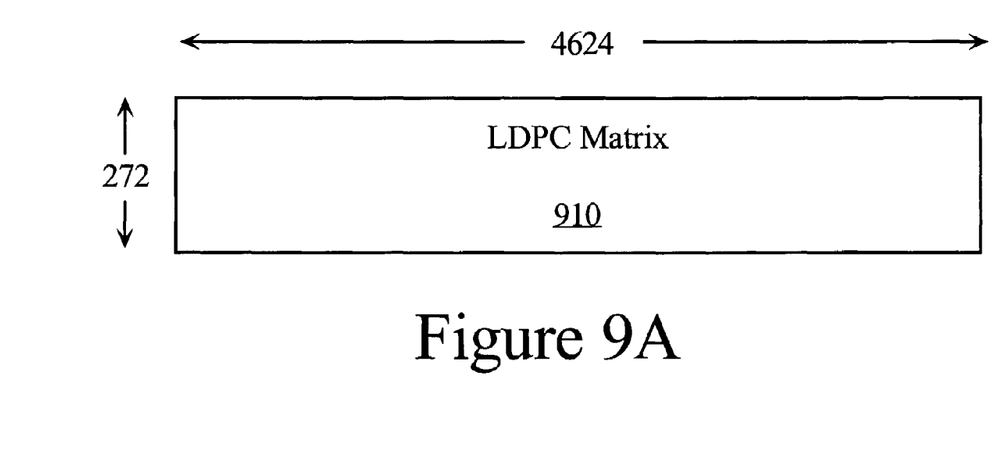
FIGS. 9A–9C depict a low-density parity check matrix according to the present invention.
Figure 9B:
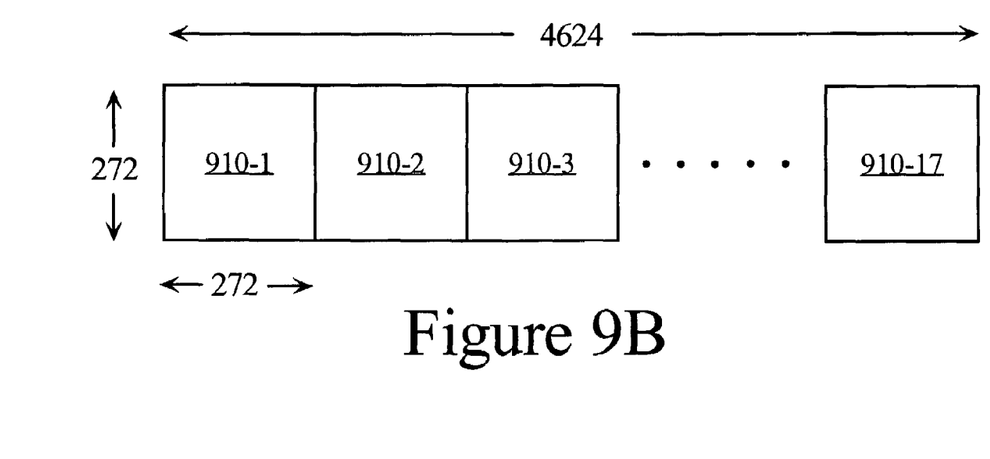

For example, the LDPC matrix 910 of FIG. 9A can be configured to be cyclic to repeat itself every so many columns such that the LDPC matrix 910 can be divided into seventeen square sub-matrices 910-1 ... 910-17 (as shown in FIG. 9B) with each of the submatrices 910-1 ... 910-17 having a size of 272 rows by 272 columns. As each sub-matrix 910-1 ... 910-17 can be computed from one another, it becomes evident that an entire 272-by-4624 matrix need not be stored as all the information in the 272-by-4624 matrix can be contained in the first row of the first 272-by-272 sub-matrix. In view of such advantages, it should be appreciated that the dimensions of an LDPC matrix can in other embodiments strategically vary with varying LDPC code rates and matrix weights with similar dynamics providing similar advantages.

Returning to FIG. 3, the RLL decoder 328 can receive the LDPC decoded data, and perform an RLL decoding operation to extract original user data. The exemplary RLL decoder 328 uses an RLL code that decodes data byte-by-byte (or word-by-word) independently to minimize error propagation. However, the particular form of the RLL code can vary as required without departing from the spirit and scope of the present invention.

Figure 4:
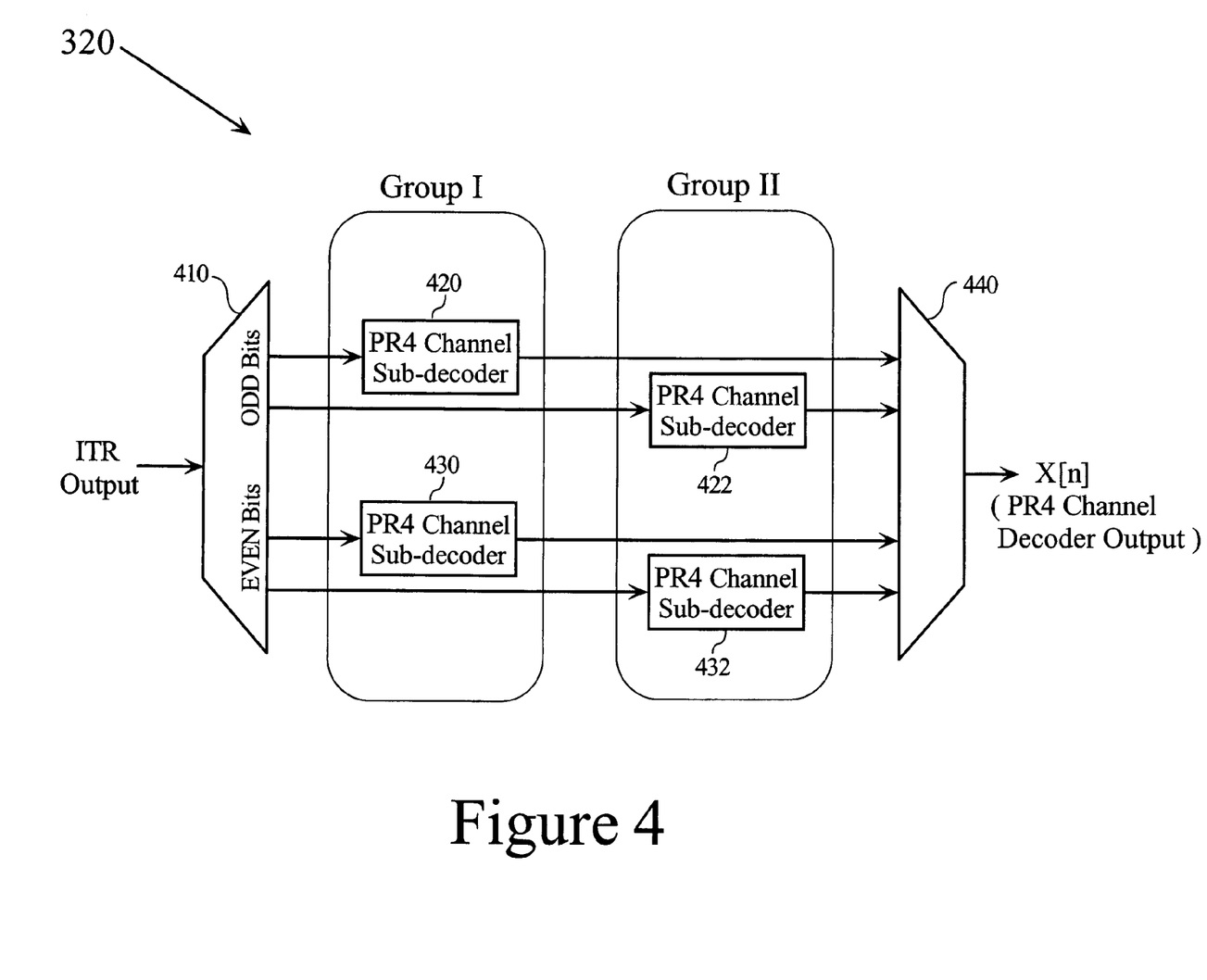
FIG. 4 is a block diagram of the PR4 channel decoder of FIG. 3.

FIG. 4 is a block diagram of the PR4 channel decoder 320 of FIG. 3. As shown in FIG. 4, the PR4 channel decoder 320 includes an interleaver 410, a number of PR4-channel sub-decoders 420, 422, 430 and 432, and a de-interleaver 440.

In operation, the interleaver 410 can receive data from a device, such as the ITR device 318 of FIG. 3, separate the received data into even and odd bits, provide the odd bits to sub-decoders 420 and 422 and provide the even bits to sub-decoders 430 and 432.

As the data bits are provided to the sub-decoders 420, 422, 430 and 432, sub-decoders 420 and 430 will work as a cooperating group as will sub-decoders 422 and 432. The two groups of sub-decoders (420, 430) and (422, 432) will then work together in an interleaved fashion with each group of sub-decoders (420, 430) or (422, 432) performing the classic forward and backward calculations characteristic of BCJR algorithms (or their max-log approximations) with an optional normalization step for further ease of processing.

As the sub-decoders 420, 422, 430 and 432 provide their respective decoded data to the de-interleaver 440, the de-interleaver 440 will appropriately assemble the interleaved PR4 decoded data, then output the assembled PR4 decoded data X[n].

Figure 5:
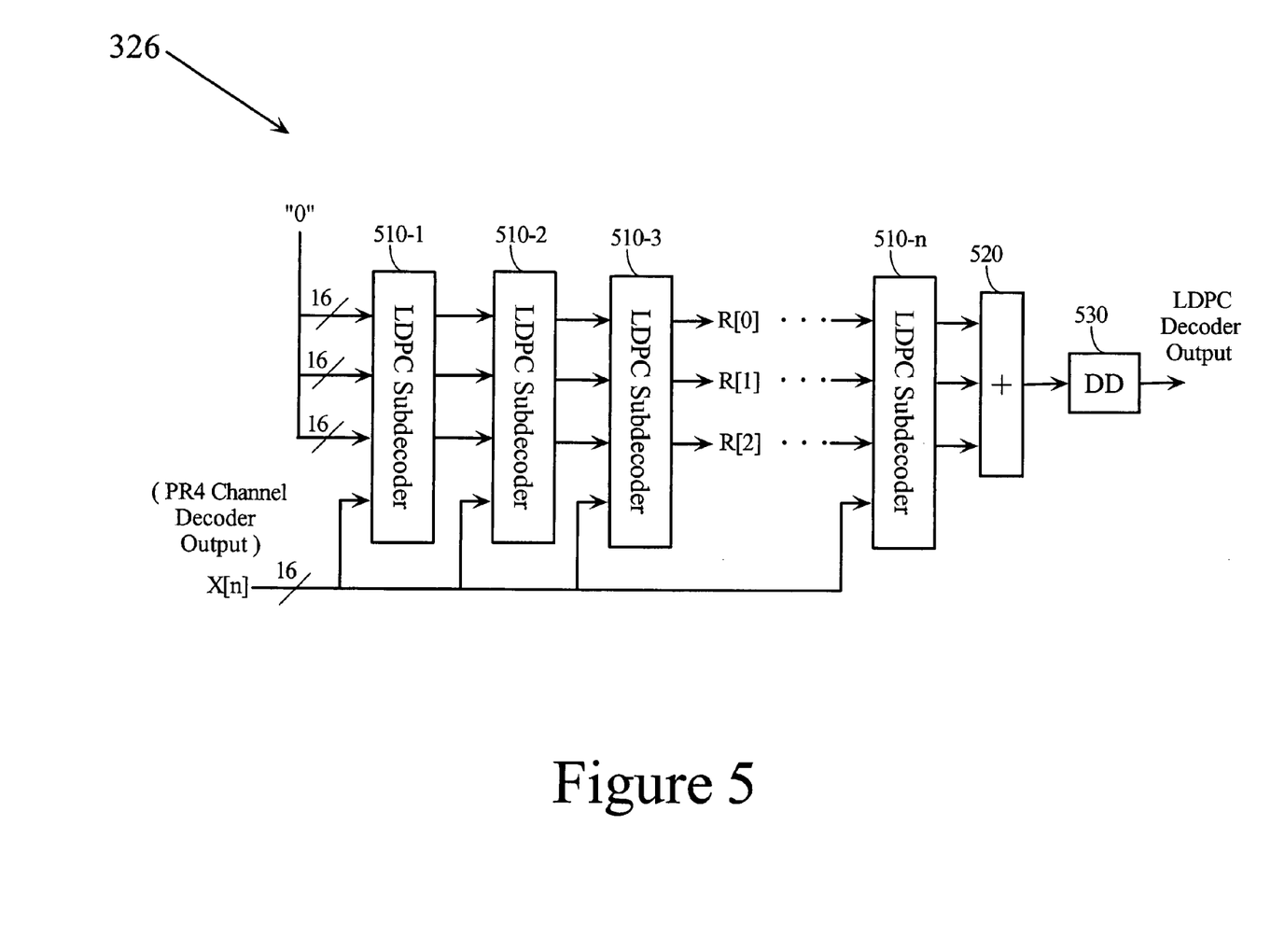
FIG. 5 is a block diagram of the LDPC decoder of FIG. 3 according to the present invention.

FIG. 5 is a block diagram of the exemplary LDPC decoder 326 of FIG. 3. As shown on FIG. 5, the exemplary LDPC decoder 326 includes n-number of LDPC sub-decoders 510-n, an adding device 520 and a decision device 530. In operation, the various LDPC sub-decoders 510-1 perform an iterative operation on received data X[n] as will be further explained below. After the last processing iteration, LDPC sub-decoder 510-n will supply its outputs R[0], R[1] and R[2] to the adding device 520. The resultant sum of the adding device 520, in turn, can be provided to the decision device 530, which can then determine and report the sign of the resultant sum.

In determining the effectiveness of the LDPC decoder 326, it should be appreciated that the inventors have discovered that good performance can be achieved with as little as twelve sub-processor iterations with the understanding that further iterations can further improve data accuracy.

Figure 6:
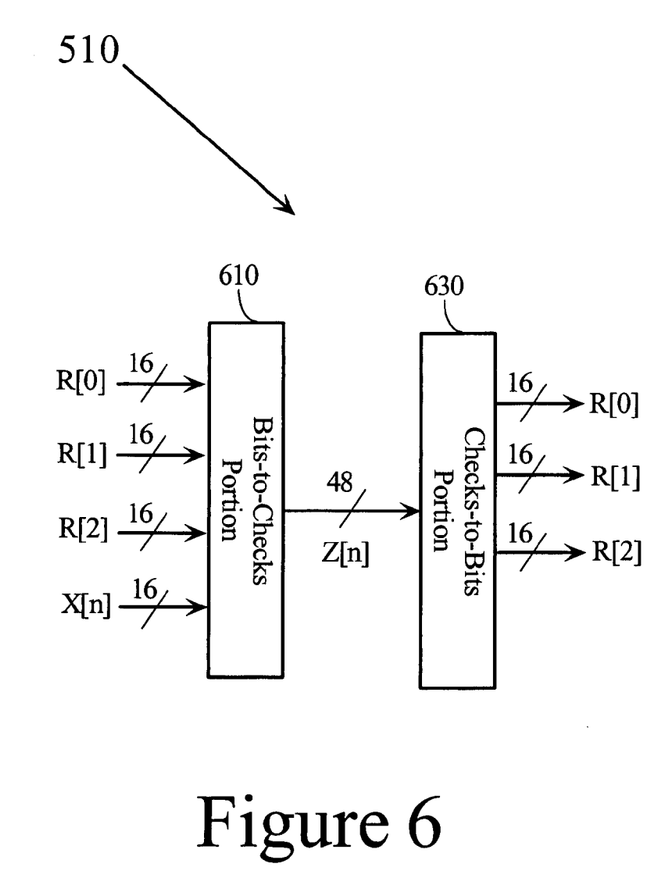
FIG. 6 is a block diagram of the LDPC sub-decoder of FIG. 5 according to the present invention.

FIG. 6 is a block diagram of an LDPC sub-decoder 510. As shown on FIG. 6, an LDPC sub-processor 510 can be divided into two parts, a bits-to-checks portion 610 and a checks-to-bits portion 630. Given this, it should be apparent that the decoding algorithm used by an LDPC decoder is an iterative process employing two basic kinds of computations—bits-to-checks computations and checks-to-bits computations. As observed in FIG. 6, there is a 48-sample conduit between the bits-to-checks portion 610 and the checks-to-bits portion 630, which demonstrates a high degree of parallelism available by the LDPC sub-decoder 510 of the present invention. Such parallelism can be attributed in great part to the form of the LDPC matrix.

Figure 9C:
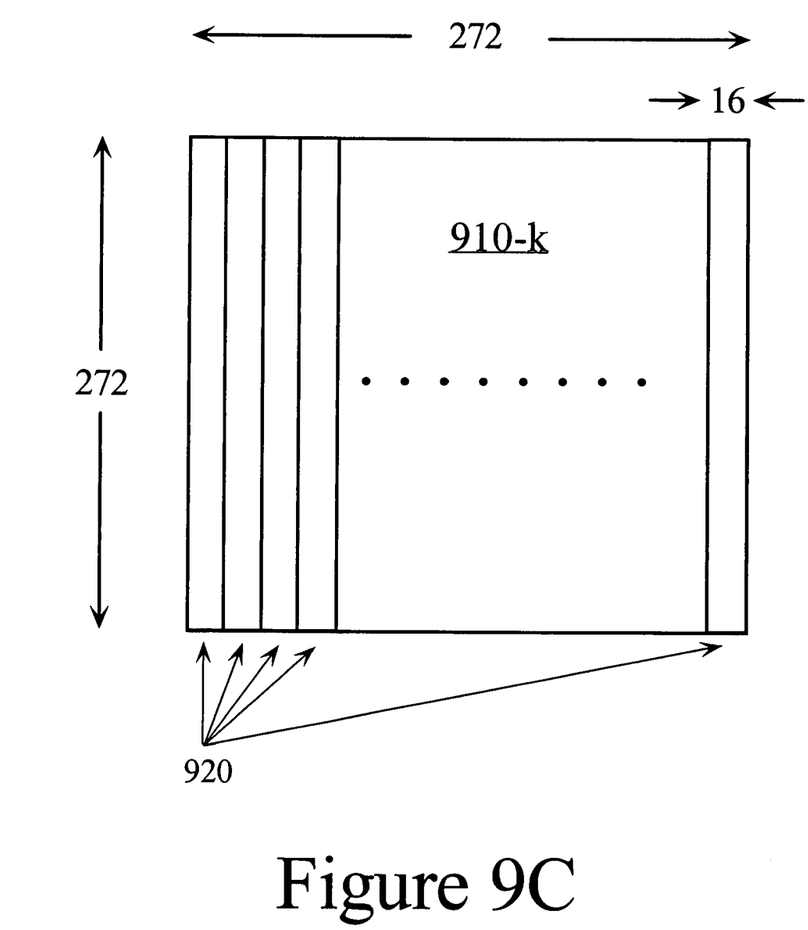

As discussed above, and demonstrated in FIGS. 9A and 9B, the LDPC decoder 326 can use a 272-by-4624 LDPC matrix that can be expressed in full by a much smaller 272-by-272 LDPC sub-matrix. However, by further constraining the LDPC sub-matrix (or similarly the LDPC matrix) to be divided into seventeen sub-portions 920 (as shown in FIG. 9C) with each sub-portion 920 having sixteen consecutive columns each (i.e., 1–16, 17–31, 33–48 ...), and require that no two of the sixteen columns within each sub-portion 920 have any common location containing a non-zero entry, then the LDPC sub-decoder 510 can perform forty-eight simultaneous operations.

Figure 7:
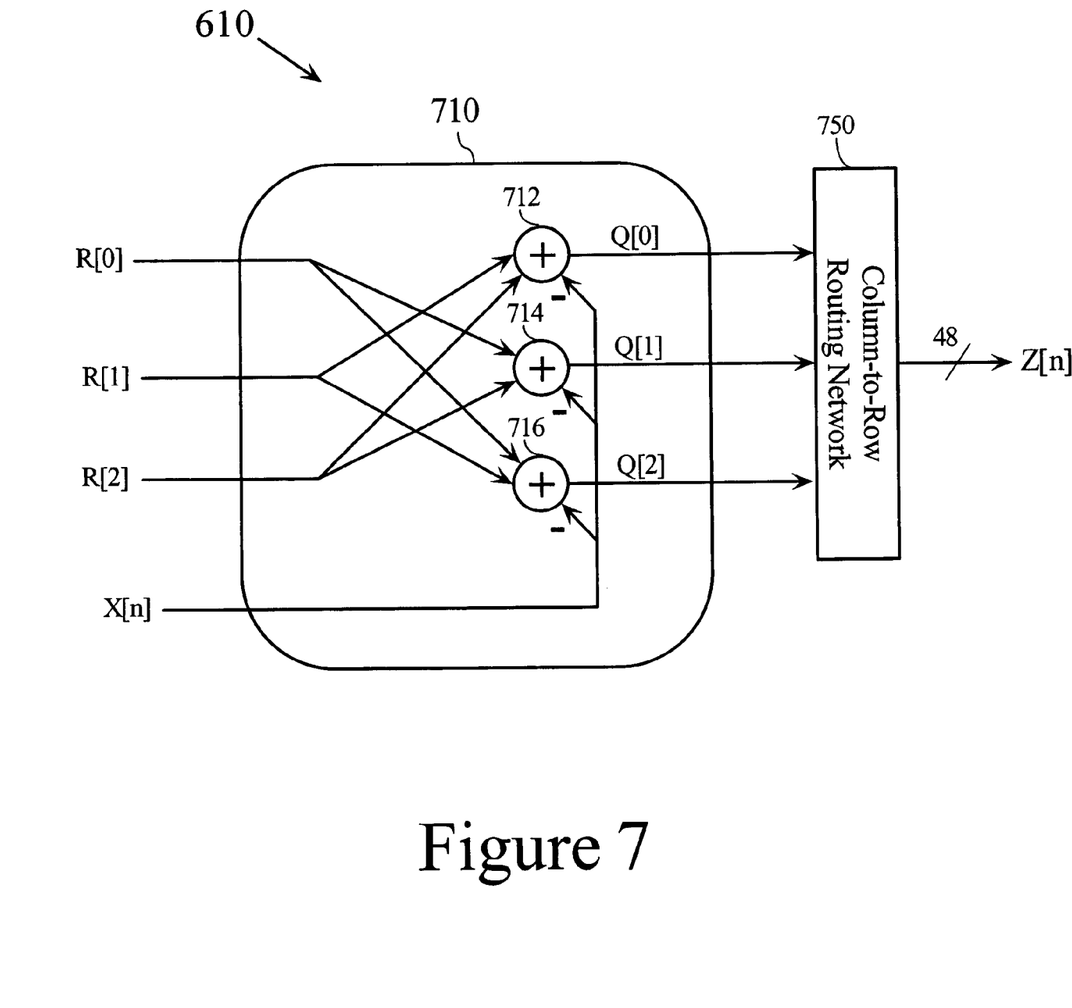
FIG. 7 is a block diagram of the bits-to-checks portion of FIG. 6.

FIG. 7 depicts the bits-to-checks portion 610 of sub-decoder 510. As shown on FIG. 6, the bits-to-checks portion 610 includes a bits-to-checks device 710 having three adding devices 712, 714 and 716 and a column-to-row routing network 750. In an iterative operation, the bits-to-checks device 710 can receive three signals R[0], R[1] and R[2] as well as a PR4 channel decoder signal X[n], and operate on the received signals to produce three outputs Q[0]=R[1]+R[2]−X[n], Q[1]=R[0]+R[2]−X[n], and Q[2]=R[0]+R[1]−X[n]. The three outputs Q[0], Q[1] and Q[2] are then provided to the column-to-row routing network 750, which reallocates each data sample to a particular row according to the above-mentioned constraints of the LDPC matrix depicted in FIGS. 9A–9c. The reallocated data is then output to an external device, such as the checks-to-bits portion 630 of FIG. 6.

Figure 8:
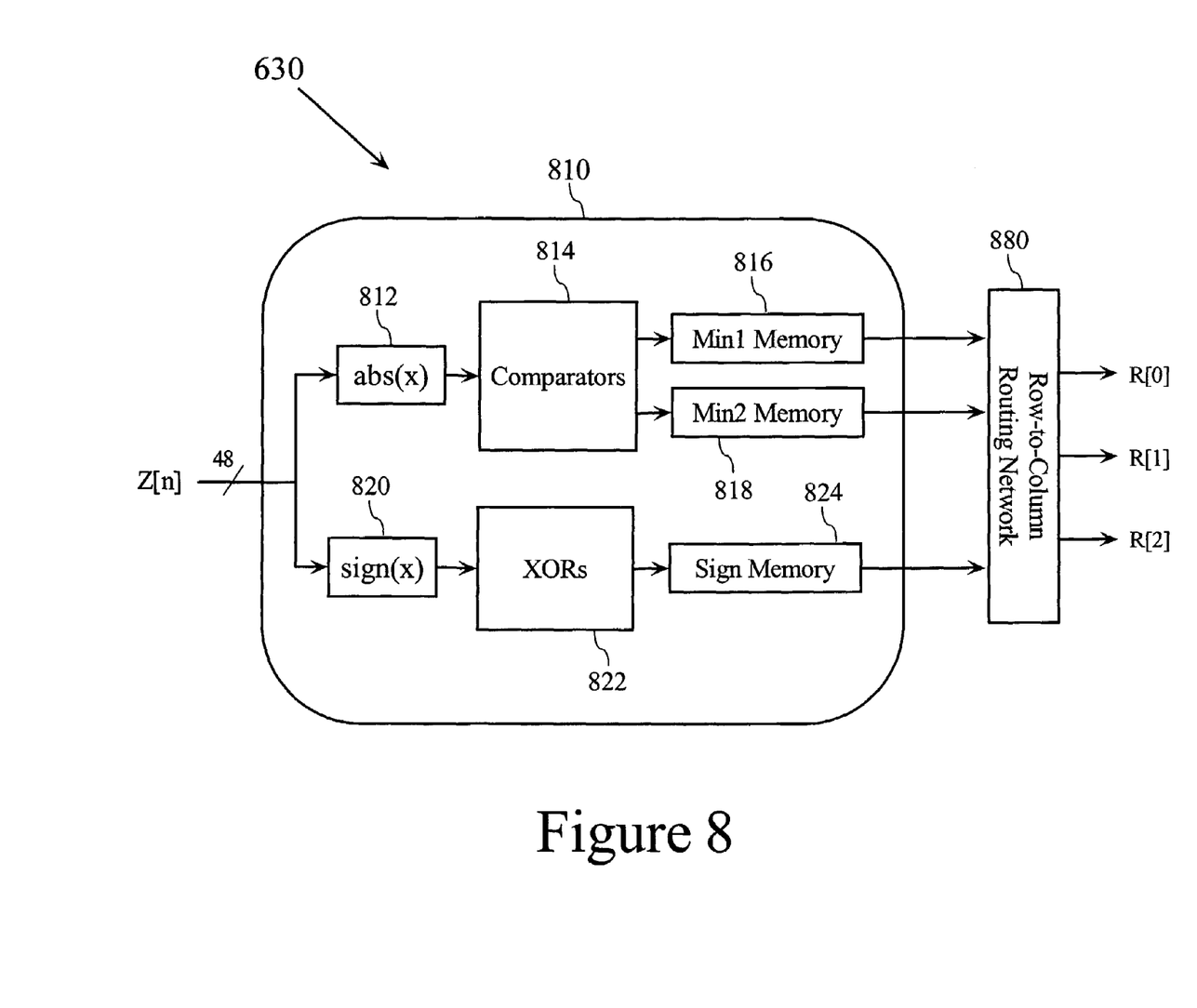
FIG. 8 is a block diagram of the checks-to-bits portion of FIG. 6 according to the present invention.

FIG. 8 is a block diagram of the checks-to-bits portion 630 of FIG. 6. As shown in FIG. 6, the checks-to-bits portion 630 includes a checks-to-bits device 810 and a row-to-column routing network 880. The checks-to-bits device 810 itself includes an absolute value device 812, an array of comparators 814, a minimum-entry memory 816, a second-minimum-entry memory 818, a sign determining device 820, an array of exclusive-OR devices 822 and a sign-memory 824.

In operation, a number of parallel samples (48 in this particular case) are received by the checks-to-bits device 810 and provided to the absolute value device 812 and the sign determining device 820.

The absolute value device 812, in turn, can take the magnitude of each received sample, and provide a set of sample magnitudes to the array of comparators 814. Similarly, the sign determining device 820 can strip each received sample of its magnitude to provide a set of sample signs ("+" or "−") to the array of exclusive-OR devices 822.

Upon reception of the sample magnitudes, the array of comparators 814 can then operate to find the sample for each particular row of the LDPC matrix having the smallest magnitude, i.e., the minimum-entry sample (a.k.a., the "min1" entry), and deposit the minimum-entry sample into the minimum-entry memory 816 (a.k.a., the "min1" memory). Similarly, the array of comparators 814 can operates to find the sample for each particular row of the LDPC matrix having the second to smallest magnitude, i.e., the second-minimum-entry sample (a.k.a., the "min2" entry), and deposit the second-minimum-entry sample into the second-minimum-entry memory 818 (a.k.a., the "min2-memory").

Upon reception of the sample signs, the array of exclusive-OR devices 822 can operate to find the exclusive-OR product for the samples of each particular row of the LDPC matrix, which will take the value of a positive(+) or negative (−) sign. Once determined, each sign-value can be deposited into the sign-memory 824.

For the present embodiment using the 272-by-4624 LDPC matrix, each of the min1-memory 816, min2-memory 818 and sign-memory 824 can hold 272 samples. Further, for each checks-to-bits computation, there will be 51 samples in each row, and each entry of the 272 rows will only take on one of four values; ±min1 or ±min2.

Returning to FIG. 8, once the min1-memory 816, min2-memory 818 and sign-memory 824 are appropriately updated, the memories 816, 818 and 824 can provide their content to the row-to-column routing network 880, which will reorganize the LDPC matrix in a reverse manner to the column-to-row routing network 750 of FIG. 7 to produce three outputs R[0], R[I] and R[2].

As discussed above, the operation of the LDPC sub-decoder 510 can be repeated as required as described by FIGS. 5–8 and respective text until adequate performance is acquired. As shown in FIGS. 1–8, the systems and methods of this invention are preferably implemented using dedicated logic or other integrated circuits. However, the systems and methods can also be implemented using any combination of one or more general purpose computers, special purpose computers, program microprocessors or microcontroller and peripheral integrating circuit elements, hardware electronic or logic circuits such as application specific integrated circuits (ASICs), discrete element circuits, programmable logic devices such as PLAs, FPGAs, PALs or the like. In general, any device on which exists a finite state machine capable of implementing the various elements of FIGS. 1–8 and the matrix of FIGS. 9A–9C can be used to implement the training sequence functions.

The foregoing describes various embodiments that provide a number of processing advantages in that both the total number of mathematical operations and required memory are reduced due at least in part to the particular dimensions and restraints of the low-density parity check matrix. Further processing advantages are gained by virtue of the architecture of the sub-decoder, including the minimum-entry approach of the sub-decoder's checks-to-bits device. In addition to reducing memory and processing, the inventive use of sync fields and tone fields provides framing information for more reliable data alignment for the low-density parity check device, thus again simplify processing.

The foregoing description of various embodiments have been presented for purposes of illustration and description. It is not intended to be exhaustive or to limit the invention to the precise form disclosed, and modifications and variations are possible in light of the above teachings or may be acquired from practice of the invention. The embodiments were chosen or described in order to explain the principles of the invention and enable one of ordinary skill in the art to utilize this systems with various modifications as would be suited to a particular use as contemplated. It is intended that the scope of the various embodiments be defined by the claims appended hereto, and their equivalents.

What is claimed is:

1. An apparatus for processing a magnetic medium having digital data residing thereon, wherein the data on the magnetic medium is formed using a number of data blocks and wherein each data block includes a tone field, comprising:
   a tone detector operative to detect a frequency in at least one tone field and provide framing information to a partial response signaling device; and
   means for performing a low-density parity check operation on the digital data residing on the magnetic medium.

2. The apparatus of claim 1, wherein the means for performing a parity check operation uses a low-density parity check code and a respective low-density parity check matrix having n-rows and m-columns where m and n are positive integer numbers, and wherein any two columns of the low-density parity check matrix have a maximum of one common location containing a non-zero entry.

3. The apparatus of claim 2, wherein the low-density parity check code has a rate of 16/17, and the low-density parity check matrix has a constant column weight of three and a constant row weight of fifty-one.

4. The apparatus of claim 1, wherein the means for performing a low-density parity check operation processes data using a low-density parity check matrix, wherein the low-density parity check matrix has a size of 272 rows by 4624 columns.

5. The apparatus of claim 4, wherein the low-density parity check matrix is formed using 17 sub-matrices, each submatrix having 272 rows and 272 columns, and each one can be computed from one another, Each row in a sub-matrix can also be computed by cyclic-shifting the previous row.

6. The apparatus of claim 4, wherein each sub-matrix of the low-density parity check matrix is divided into 17 subportions, each sub-portion having 16 consecutive columns, and wherein each sub-portion is constructed such that any 2 columns within the sub-portion have no common location containing a non-zero entry.

7. The apparatus of claim 1, wherein the data on the magnetic medium is formed using a number of data blocks, each data block including a data field, a sync field and a tone field.

8. The apparatus of claim 1, wherein the data on the magnetic medium is formed using a number of data blocks, each data block including a tone field; and wherein the apparatus further includes a tone detector that detects a frequency in at least one tone field, then provides framing information for a partial response signaling device.

9. The apparatus of claim 1, wherein the data on the magnetic medium is formed using a number of data blocks, each data block including a sync field; and wherein the apparatus further includes a sync detector that detects a sequence in at least one sync field, then provides alignment information for aligning data to the low-density parity check means.

10. An apparatus for processing magnetically stored data, comprising:
a magnetic medium having digital data residing thereon; and
means for performing a low-density parity check operation on the digital data residing on the magnetic medium, wherein the means for performing a low-density parity check operation processes data using a low-density parity check matrix, wherein the low-density parity check matrix has a size of 272 rows by 4624 columns, and wherein the means for performing a low-density parity check operation includes a checks-to-bits device that determines the minimum-entry for a particular row of the low-density party check matrix, and further determines the second-minimum-entry in the same particular row.

11. The apparatus of claim 10, wherein the checks-to-bits device further determines a sign value.

12. The apparatus of claim 11, wherein the checks-to-bits device assigns one of a. +−.min1 or a. +−.min2 value to a row of the low-density parity check matrix.

13. An apparatus for performing a low-density parity check operation on a block of received data, comprising:
means for performing a bits-to-checks computation, wherein the means further comprise a bits-to check device; and
means for performing a check-to-bits computation, wherein the means further comprises a checks-to-bits device that determines the minimum-entry for a particular row of a low-density parity check matrix, and further determines the second-minimum-entry in the same particular row, and wherein the low-density parity check matrix has a size of 272 rows by 4624 columns.

14. The apparatus of claim 13, wherein the checks-to-bits device further determines a sign value.

15. The apparatus of claim 13, wherein the low-density parity check matrix is cyclic.

16. The apparatus of claim 13, wherein the apparatus uses a low-density parity check matrix having a size of two-hundred seventy-two rows by four-thousand six-hundred and twenty-four columns, and wherein the low-density parity check matrix is divided into seventeen sub-matrices of two-hundred seventy-two rows by two-hundred seventy-two columns.

17. The apparatus of claim 16, wherein wherein each sub-matrix of the parity check matrix is divided into seventeen sub-portions, each sub-portion having sixteen consecutive columns, and wherein each sub-portion is constructed such that any two columns within the sub-portion have no common location containing a non-zero entry.

18. The apparatus of claim 13, wherein the apparatus uses a low-density parity check code having a rate of 16/17, and the low-density parity check matrix has a constant column weight of three and a constant row weight of fifty-one.

19. A system for processing magnetically stored data, comprising:
a magnetic medium having digital data residing thereon, the digital data being formed using a number of data blocks, each data block including at least a data field and a tone field; and
a decoder that includes a tone detector that detects a frequency in at least one tone field, then provides framing information to a partial response signaling device.

20. The system of claim 19, wherein each data block, further includes a sync field; and wherein the decoder further includes a sync detector that detects a sequence in at least one sync field, then provides alignment information for aligning data to a low-density parity check device.

21. An apparatus for decoding encoded digital data formed into a number of data blocks, each data block including at least a field of original data, a tone field, and a sync field, comprising:
a read/write head that is configured to read the encoded digital data and output its data blocks as a digitized signal to a pre-processor;
a pre-processor that is configured to correct the digitized signal for any asymmetry and output the corrected signal to a tone detector and a finite in pulse response filter;
a tone detector that is configured to detect a frequency in at least one tone field in the corrected signal and output framing information to a partial response signaling device and the corrected signal to the sync detector;
a finite impulse response filter that is configured to perform an equalization process on the corrected signal and output the equalized signal to an interpolate timing recovery device;
an interpolate timing recovery device that is configured to recover timing and frequency information from the equalized signal and output a gain-compensated, equalized signal to the partial response signaling device, wherein the interpolate timing recovery device further comprises an automatic gain control device that is configured to compensate for any gain change to the equalized signal;
a partial response signaling device that is configured to perform a partial response decoding operation on the gain-compensated, equalized signal, using the framing information from the tone detector, and output PR4 decoded data to an un-shuffler and a sync detector;

a sync detector that is configured to detect at least one sync field in the PR4 decoded data, using the corrected signal from the tone detector, and output an alignment signal to the un-shuffler and the low parity density decoder;

an un-shuffler that is configured to extract and order parity bits in the PR4 decoded data, using the alignment signal from the sync detector, and output un-shuffled data to the low parity density decoder;

a low parity density decoder that is configured to perform a low parity density decoding operation on the un-shuffled data, using the alignment signal from ti e sync detector, and output LDPC decoded data to the run-length limiting decoder; and a run-length limiting decoder that is configured to perform a run-length limiting decoding operation on the LDPC decoded data to extract the original data.

* * * * *

UNITED STATES PATENT AND TRADEMARK OFFICE
CERTIFICATE OF CORRECTION

PATENT NO. : 7,222,289 B2
APPLICATION NO. : 10/673181
DATED : May 22, 2007
INVENTOR(S) : William Ching-Chit Hung It is certified that error appears in the above-identified patent and that said Letters Patent is hereby corrected as shown below:

Column 8, line 58, add --low-density-- between the word "a" and "parity"
Column 10, line 12, delete the second "wherein"
Column 10, line 13, add --low-density-- between the words "the" and "parity"
Column 12, line 3, change "ti e" to --the--

Signed and Sealed this

Seventh Day of August, 2007

JON W. DUDAS
*Director of the United States Patent and Trademark Office*